US012053893B2

(12) United States Patent
Loulavi et al.

(10) Patent No.: US 12,053,893 B2
(45) Date of Patent: Aug. 6, 2024

(54) MODULE INSERTION SYSTEM FOR ROBOTIC ASSEMBLY

(71) Applicant: Bright Machines, Inc., San Francisco, CA (US)

(72) Inventors: Ran Loulavi, Tel Aviv (IL); Nikolay Shtanikov, Haifa (IL); Ivan Hin-Kwan Chew, Alameda, CA (US); James Leo McCormick, San Jose, CA (US); Stephen Hoyt Hancock, Wake Forest, NC (US); Jeremy Avizrat, Ashdod (IL); Shai Mordechai Niezni, Herzliya (IL); Dov Kariv, Vradim (IL); Leonid Epstein, Ahuzat Barak (IL)

(73) Assignee: Bright Machines, Inc., San Francisco, CA (US)

( * ) Notice: Subject to any disclaimer, the term of this patent is extended or adjusted under 35 U.S.C. 154(b) by 860 days.

(21) Appl. No.: 16/949,754

(22) Filed: Nov. 12, 2020

(65) Prior Publication Data

US 2021/0138653 A1    May 13, 2021

Related U.S. Application Data

(60) Provisional application No. 62/934,381, filed on Nov. 12, 2019.

(51) Int. Cl.
*B25J 15/12* (2006.01)
*B25J 9/00* (2006.01)
(Continued)

(52) U.S. Cl.
CPC ............ *B25J 9/1687* (2013.01); *B25J 9/0096* (2013.01); *B25J 9/1633* (2013.01); *B25J 13/085* (2013.01);
(Continued)

(58) Field of Classification Search
CPC ........ B25J 9/1687; B25J 9/0096; B25J 15/12; B25J 15/0066; B25J 13/088; B25J 13/085; B25J 17/0241
(Continued)

(56) References Cited

U.S. PATENT DOCUMENTS

| 7,996,112 B1 * | 8/2011 | Behar .................. B62D 57/032 700/258 |
| 9,750,170 B2 | 8/2017 | Zhang et al. |

(Continued)

FOREIGN PATENT DOCUMENTS

| CN | 104302163 A | 1/2015 |
| CN | 106413981 A | 2/2017 |

(Continued)

OTHER PUBLICATIONS

International Search Report and Written Opinion, PCT App. No. PCT/US2020/070779, Mar. 12, 2021, 13 pages.
(Continued)

*Primary Examiner* — Paul T Chin
(74) *Attorney, Agent, or Firm* — Nicholson De Vos Webster & Elliott LLP; Judith Szepesi

(57) ABSTRACT

A two-stage insertion system including a gripper to grip a module, a compliance element to provide movement in the XY axis, a first stage insertion control to insert the module into a socket, to a first level, and a second stage insertion control to complete the insertion of the module into the socket, when the first stage insertion control indicates that the module is aligned to the socket, the second level insertion control exerting enough force to complete the insertion of the module into the socket.

22 Claims, 18 Drawing Sheets

(51) Int. Cl.
  *B25J 9/16*   (2006.01)
  *B25J 13/08*  (2006.01)
  *B25J 15/00*  (2006.01)
  *B25J 15/08*  (2006.01)
  *B25J 17/02*  (2006.01)
  *H05K 13/04*  (2006.01)

(52) U.S. Cl.
  CPC ......... *B25J 13/088* (2013.01); *B25J 15/0066* (2013.01); *B25J 15/12* (2013.01); *B25J 17/0225* (2013.01); *B25J 17/0233* (2013.01); *B25J 17/0241* (2013.01); *H05K 13/0408* (2013.01)

(58) Field of Classification Search
  USPC ........................................................ 294/213
  See application file for complete search history.

(56) References Cited

U.S. PATENT DOCUMENTS

| | | | |
|---|---|---|---|
| 11,565,422 B2 * | 1/2023 | Ooba | B25J 19/023 |
| 11,618,248 B2 * | 4/2023 | Brockschmidt | F16D 65/16 |
| | | | 156/367 |
| 11,679,508 B2 * | 6/2023 | Koga | B25J 9/1664 |
| | | | 700/259 |
| 2001/0024044 A1 | 9/2001 | Kosuge et al. | |
| 2014/0170881 A1 | 6/2014 | Decesaris et al. | |
| 2015/0020374 A1 | 1/2015 | Hu et al. | |
| 2017/0050323 A1 | 2/2017 | Shi et al. | |
| 2017/0168475 A1 | 6/2017 | Choi et al. | |
| 2017/0190515 A1 | 7/2017 | Kuraoka et al. | |
| 2018/0255670 A1 | 9/2018 | Watanabe et al. | |

FOREIGN PATENT DOCUMENTS

| | | | |
|---|---|---|---|
| CN | 106466821 A | | 3/2017 |
| CN | 106862918 A | | 6/2017 |
| CN | 206795885 U | | 12/2017 |
| EP | 3150329 A1 | | 4/2017 |
| WO | 2002/067034 | | 8/2002 |
| WO | WO 02/067034 | * | 8/2002 |

OTHER PUBLICATIONS

First Office Action, CN App. No. 202080085124.8, Apr. 30, 2024, 15 pages (7 pages of English Translation and 8 pages of Original Document).

* cited by examiner

MODULE INSERTION SYSTEM FOR ROBOTIC ASSEMBLY

RELATED APPLICATION

The present application claims priority to U.S. Provisional Patent Application No. 62/934,381, filed on Nov. 12, 2019, which is incorporated herein by reference in its entirety.

FIELD

The present invention relates to robotic assembly, and more particularly to a insertion system for robotic assembly.

BACKGROUND

Robotic assembly systems assemble computer systems and other devices. One of the expensive elements in assembly are the modules, such as dual in-line memory modules (DIMMs) inserted into sockets on the board. A module inserted incorrectly can damage the module and the socket, which can render the entire board unusable, and is an expensive error considering that there are typically 12 to 24 sockets per board, and damaging any one of those sockets can scrap the entire board. Module insertion needs high accuracy which accounts for real world variation in pitch, yaw, and rotation of the part on the board. Incorrect or incomplete insertion of modules can cause defects and rework for manufacturers. And most insidiously, it may lead to board-level failures long after the board has passed testing at the manufacturer, and has entered its service life in an end-customer product or data center rack.

BRIEF DESCRIPTION OF THE FIGURES

The present invention is illustrated by way of example, and not by way of limitation, in the figures of the accompanying drawings and in which like reference numerals refer to similar elements and in which.

DETAILED DESCRIPTION

A two-stage insertion system for inserting modules, such as DIMM modules, into a socket is described. The two-stage insertion system provides a first insertion stage which tests the accuracy of the alignment of the module with the socket, and a second insertion stage which provides the force to fully seat the module in the socket once the alignment is validated. In this way, the system ensures that sockets and modules remain undamaged by the insertion. The insertion system in one embodiment includes a compliance element which provides flexibility enabling the module to shift slightly to accommodate positioning disparities during insertion.

While the inserted modules may be any kind of module inserted into a socket, in one embodiment, the modules are DIMMs (dual in-line memory modules). Thus, in the description below the system may be referred to as a DIMM insertion system. It should be understood that although the term "DIMM" is used, the insertion system may be used to insert any kind of module into an appropriate socket during assembly.

The following detailed description of embodiments of the invention makes reference to the accompanying drawings in which like references indicate similar elements, showing by way of illustration specific embodiments of practicing the invention. Description of these embodiments is in sufficient detail to enable those skilled in the art to practice the invention. One skilled in the art understands that other embodiments may be utilized, and that logical, mechanical, electrical, functional and other changes may be made without departing from the scope of the present invention. The following detailed description is, therefore, not to be taken in a limiting sense, and the scope of the present invention is defined only by the appended claims.

Figure 1:
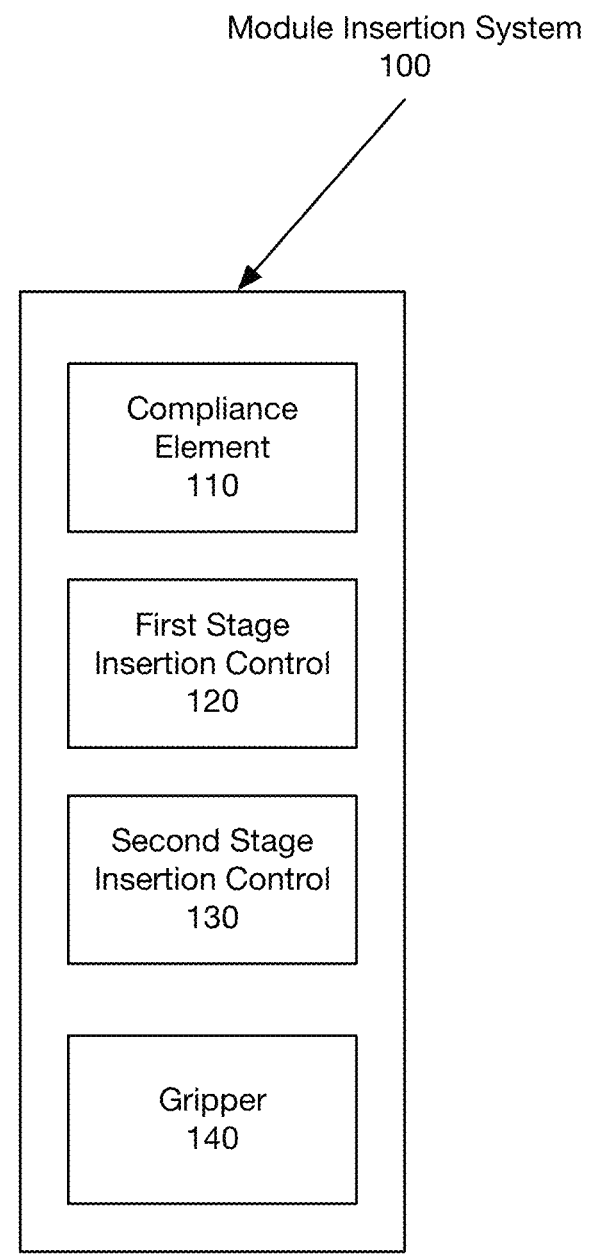
FIG. 1 an overview block diagram of one embodiment of a insertion system.

FIG. 1 an overview block diagram of one embodiment of a insertion system. The insertion system 100 includes a gripper 140 to grip the module, and a two-stage insertion system including first stage insertion control 120 and second stage insertion control 130. The system further includes a compliance element 110 which provides flexibility enabling the module to shift slightly to accommodate positioning disparities during insertion. The compliance element provides for small movements in the X, Y, and theta θ. This enables the system to adjust for small imperfections in the positioning of sockets, or shapes of the module.

The first stage insertion control 120 performs the first stage of insertion, lowering the gripper until the module is engaged with the socket. However, the first stage insertion control 120 does not push the module strongly enough to damage either the module or the socket, if there is a misalignment. The alignment is verified at the first stage of insertion, in one embodiment via a sensor, and if the alignment is correct, the second stage insertion control 130 provides the stronger insertion force to properly seat the module in the socket. If at the first stage of insertion control 120 the system determines that there is a misalignment, the gripper 140 is lifted. In one embodiment, an alert may be sounded, when a misalignment is detected. In one embodiment, the system may re-attempt insertion one or more times.

If the first stage insertion control 120 fails one (or multiple) attempts, the module and/or socket is deemed to be defective. In one embodiment, the system may send an alert.

Figure 2:
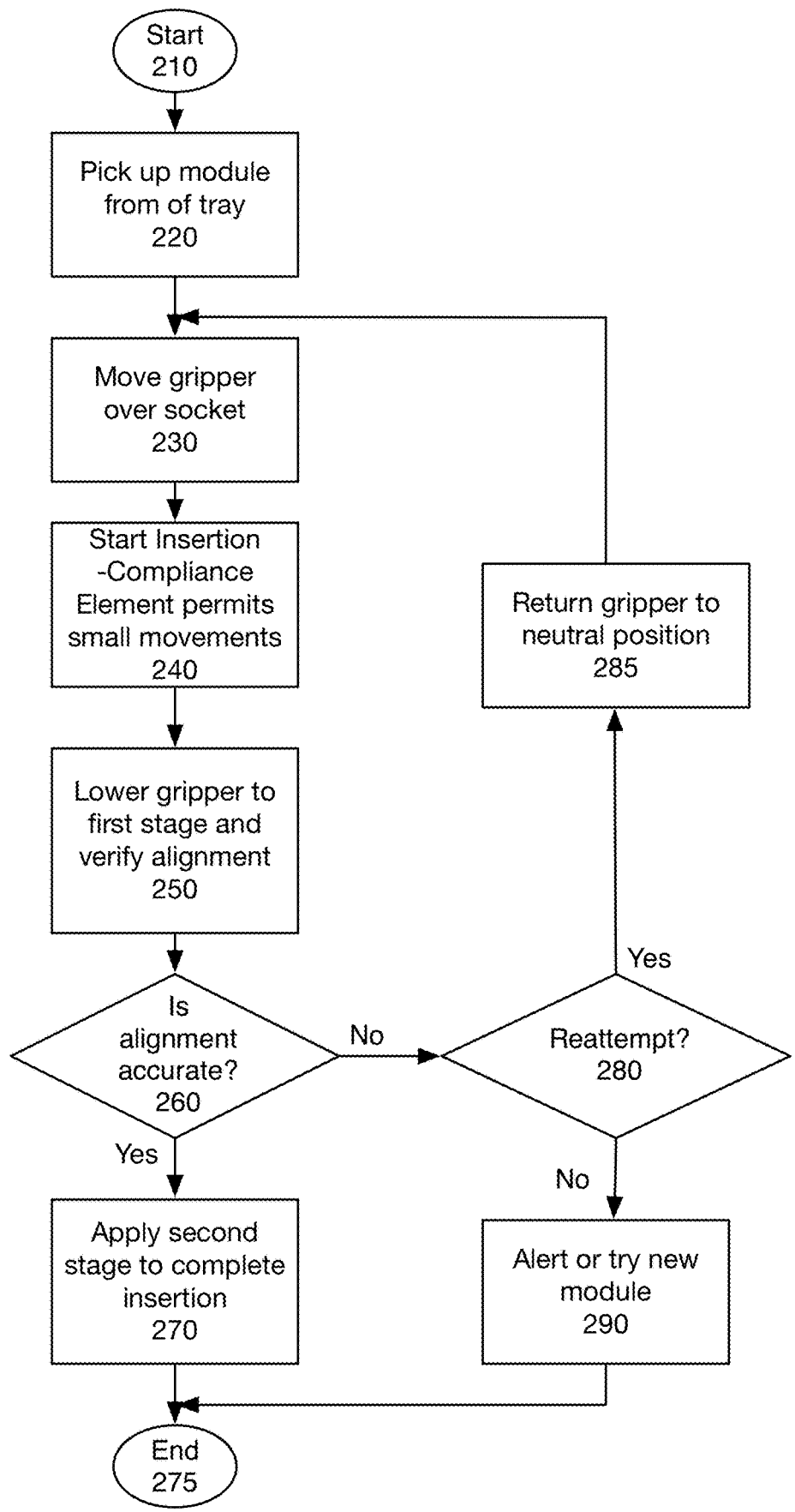
FIG. 2 is an overview flowchart of one embodiment of a insertion system.

FIG. 2 is an overview flowchart of one embodiment of an insertion system. The process starts at block 210. At block 220, the system picks up the module for insertion from a tray, conveyor, or other mechanism which positions the modules in proximity to the system.

At block 230, the gripper is moved over the socket for the module.

At block 240, the insertion is started, by lowering the gripper to start the insertion. In one embodiment the socket has a chamfer. As the module is lowered into the socket, the compliance element permits small movements, which allow the module to correctly seat into the chamfer and thus the socket.

The gripper is lowered to the first stage, and alignment is verified, at block 250. Alignment at this stage may be verified by determining if any displacement or force is found. This may be done by using spring(s) with calibrated positional sensor(s), using a calibrated load cell, or other methods. If the module is correctly seated in the socket, no displacement is detected or the amount of force needed is low, whereas if the module is incorrectly positioned, a considerable amount of displacement or force is detected. The displacement is the result of the mis-alignment spring stage not moving in z while the rest of the system "over travels" in z, leading to a relative motion, constrained in z.

At block 260, the process determines whether the alignment is accurate. In one embodiment, this is done by measuring the amount of force exerted. This may be done by using spring(s) with calibrated positional sensor(s), using a calibrated load cell, or other methods. If the alignment is accurate, at block 270 the second insertion stage is activated, lowering the module into the socket with sufficient force to complete insertion into the socket. In one embodiment, the second stage insertion uses a rocker to apply the force centrally to the module. This reduces the risk of deformation due to the insertion process, and ensures that the module is correctly aligned to the socket. The process then ends at block 275. If the alignment is not accurate, at block 260, the process continues to block 280.

At block 280, in one embodiment, the process determines whether to reattempt the insertion. In some cases, the misalignment may be the result of an incorrect grip, or an error in the approach. In one embodiment, to re-attempt insertion the gripper returns to a neutral position at block 285. In one embodiment, the gripper may re-grip the module as well. The process then returns to block 230, or optionally 220, to restart the process.

If the process is not reattempting, or after a number of re-attempts, at block 290 the system alerts to a misalignment issue. In one embodiment, in addition to, or in place of, alerting, the system may attempt to insert a new module into the same socket. This ensures that the error is in the socket rather than the module In one embodiment, the system may attempt multiple modules before identifying a socket as being the issue. The process then ends at block 275.

Figure 3:
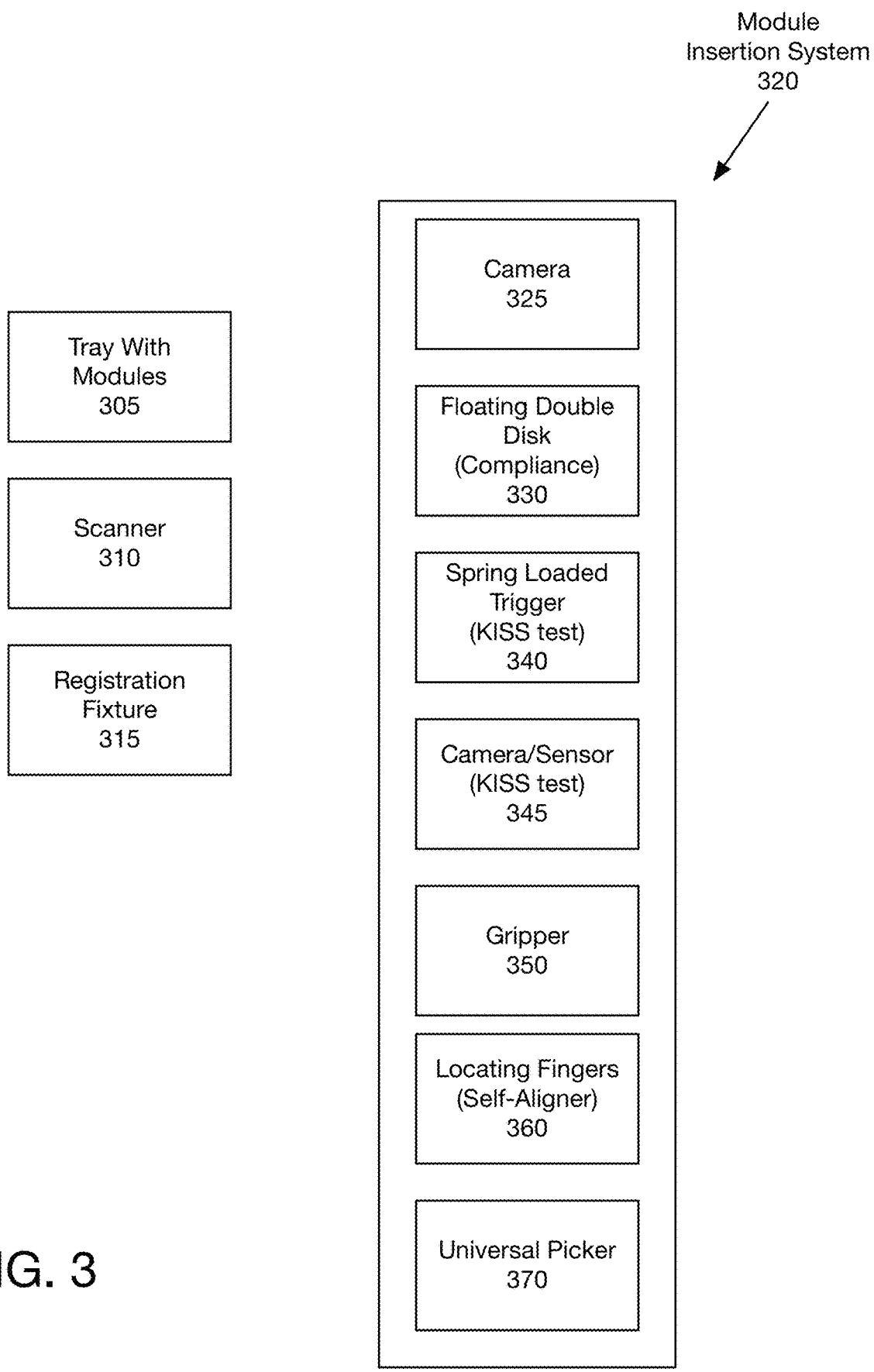
FIG. 3 is a block diagram of one embodiment of a first configuration of a DIMM insertion system.

FIG. 3 is a block diagram of one embodiment of a first configuration of a module insertion system. The module insertion system 320 is one embodiment of the insertion system of FIG. 1.

In one embodiment, the module insertion system 320 includes a universal picker 370 which picks up a module from a native tray 305. In one embodiment, this is a standard tray on which modules are generally brought to an insertion system. Alternatively, the universal picker 370 may pick up a module from any other source location. In one embodiment, the universal picker 370 is a parallel gripper such as the MPG-plus25 from SCHUNK™, which is attached via a rotary actuator such as the MDSUB1-90D-S9PSAPC from SMC, so that the universal picker 370 can rotate into any position to pick up the module from any native supplier tray or other source. In one embodiment, the universal picker 370 rotates out of the way to prevent interference on the board/socket/main part assembly, and after the picker places the module in a registration fixture 315.

The universal picker 370, in one embodiment, puts the module before a scanner 310. The scanner 310 scans a QR code, UPC code, or other registration code on the module. This enables tracking each module that is inserted. It also enables verification that the module is the appropriate one for the socket configuration.

The universal picker 370 places the module in a registration fixture 315. The registration fixture 315 in one embodiment is shaped to accept the module in almost any alignment. The registration fixture 315 then closes, creating a perfectly aligned module, for pickup by the gripper 350. In one embodiment, the registration fixture utilizes a WSG 025-064-B servo gripper from SCHUNK™, and v-groove centering blocks for precise alignment.

The gripper 350 picks up the module from the registration fixture 315.

The gripper 350 is used to insert the module into a socket. In one embodiment, a camera 325 is mounted at the end of the arm. The camera 325 is used to determine location of the PCB fiducial(s). Once the fiducial(s) are found, in one embodiment, the position points of insertion are transposed to overlay the actual board. This permits overcoming positional variations in X, Y, and theta from part to part.

In one embodiment, the system further includes locating fingers 360, which align the gripper 350 with the socket. In one embodiment, the locating fingers 360 are lowered prior to lowering of the gripper. Once the locating fingers are aligned with the socket, ensuring that the gripper is correctly positioned, the gripper is lowered to the first stage.

In one embodiment, a floating double disk 330 provides compliance so that the gripper (and thus the module) can move freely to ensure that the insertion is successful. In one embodiment, the compliance element is an XY compensator from SCHUNK™, such as the AGE-XY-50. In one embodiment, the floating double disk compliance element 330 provides XY compensation of +/−4 mm and rotary compensation of +/−16 degrees. In one embodiment, the compensation is frictionless, and the system has an automatic re-centering.

In one embodiment, interference test uses a spring-loaded trigger 340 and camera/sensor 345 to determine, at a first stage of insertion, whether the module is correctly aligned. At the first insertion level (e.g. with a pre-determined lowering of the gripper, to insert the module into the socket) the spring-loaded trigger is evaluated by the camera/sensor 345. If the spring-loaded trigger 340 indicates that the level of force on the module is too high, a misalignment is identified. In one embodiment, the spring includes a flag which is detected by the camera/sensor if the compression is above a threshold.

If the level of force (e.g. the compression of spring 340) is appropriate, the module is identified as correctly aligned, the insertion is completed. This is done by applying a higher level of force to seat the module in the socket and close the latches. In one embodiment, the higher level of force is applied centrally to the module, via a central insertion element. In one embodiment, a sensor is mounted in-line with the second stage spring system and pre-calibrated by tightening to position on a slot to a threshold force required for the installation of the module.

In one embodiment, the module insertion system is part of a robotic assembly system, and is able to complete a module insertion, from pickup to latch-closed and insertion completed. Module insertion speed is correlated to the downward movement of the robot or actuator in the z-axis. The insertion speed is tuned by mitigating impulse forces due to friction. There is also a supplier recommended speed of inserting modules which act as guidelines for manufacturing. The overall time it takes for insertion is also based on the location of the elements and acceleration and deceleration of the robot and its payload. In one embodiment, with a unitary system as shown, the process is about 12-16 seconds per cycle. In one embodiment, the system may utilize a dual arm system, in which a universal picker places the module into the registration gripper while a separate arm including the gripper inserts the previously registered module into the socket, reducing the cycle time to 6-8 seconds.

Figure 4:
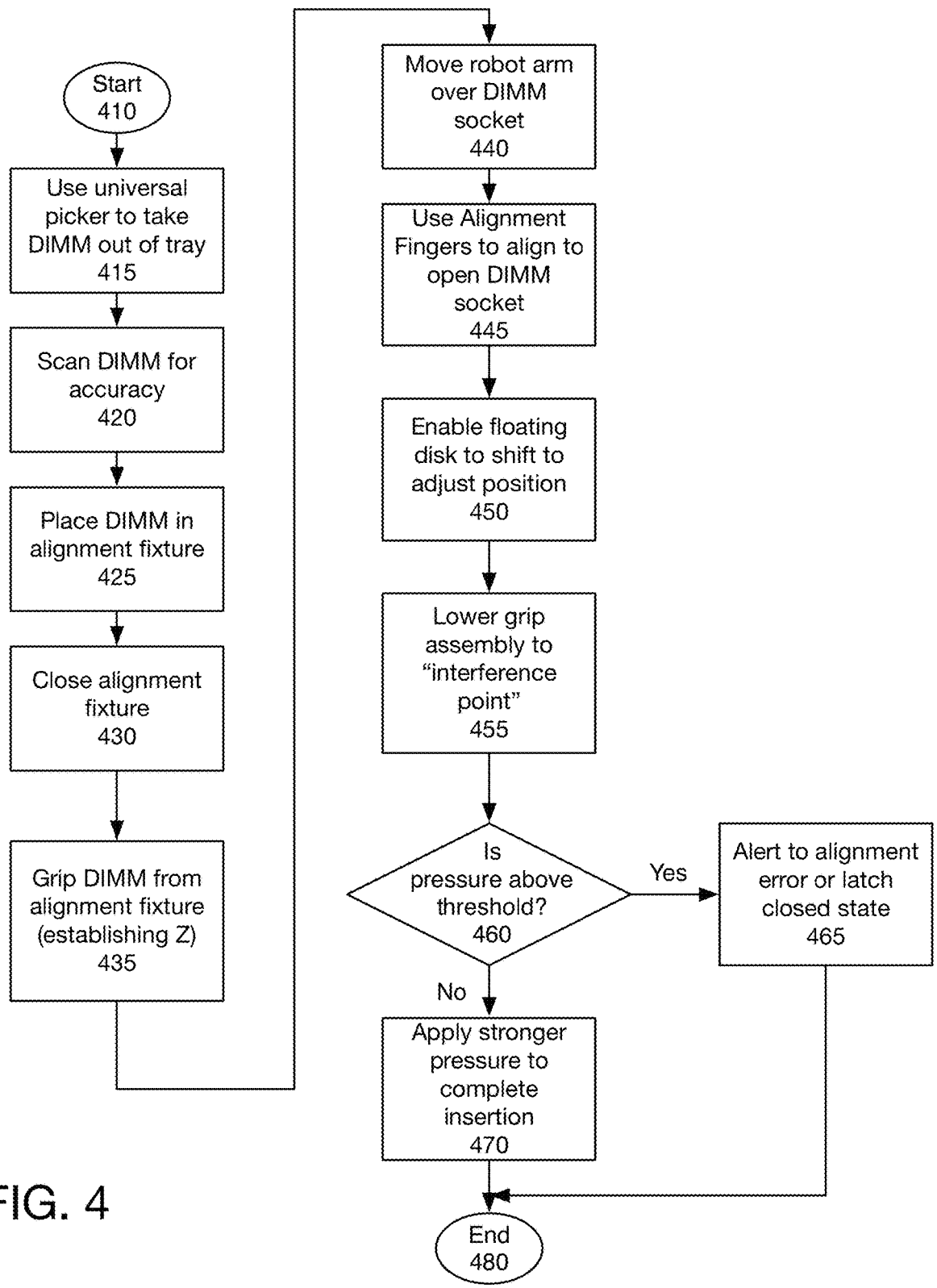
FIG. 4 is a flowchart of one embodiment of using the first configuration of the module insertion system.

FIG. 4 is a flowchart of one embodiment of using the first configuration of the module insertion system to insert an exemplary DIMM module. FIGS. 5, 6A, and 6B, are illustrations of one embodiment of the first configuration of the module insertion system.

The process starts at block 410.

At block 415, the universal picker is used to take the DIMM out of the tray or other mechanism which brings DIMM modules to the system.

At block 420, in one embodiment, the DIMM is scanned for accuracy. In one embodiment, DIMM modules include a UPC code or other scannable code, which identifies the module. In one embodiment, the scanned data is provided to a computer system which verifies the identity of the DIMM module, and that it matches the board being assembled. If there is a mismatch in the scan, in one embodiment, an alert is sounded.

At block 425, the universal picker places the DIMM in the alignment fixture. The alignment fixture is open, which enables it to accept a DIMM regardless of its orientation and physical position.

At block 430, the alignment fixture is closed. As noted above, the alignment fixture is closed by moving the ends and sides toward the DIMM module, into a configuration which closely holds the DIMM module. Once the alignment fixture is closed, the DIMM module's position is fixed.

Thus, at block 435, the gripper picks up the DIMM from the alignment fixture. This establishes the Z position for the gripper.

At block 440, the robot arm is moved over the DIMM socket.

At block 445, the alignment fingers are lowered, to engage with the edges of the socket, in one embodiment. The alignment fingers are used, in one embodiment, to identify the edges of the socket, and to position the gripper appropriately to insert the DIMM into the socket. During this alignment, the floating disk compliance element enables the gripper to shift to adjust the position to alignment, at block 450.

At block 455, the grip assembly is lowered to the interference point. The interference point is the point the DIMM would be interfering with the edge of the socket if it were misaligned, but would be experiencing almost no pressure if it were properly aligned.

At block 460 the process determines whether the upward pressure on the gripper is above a threshold. In one embodiment, this is determined using a spring having a marking showing the level of compression. When the marking flag is showing, the pressure is above a threshold (the spring has been compressed by a certain amount). Other ways of determining the level of pressure may be used.

If the pressure is not above the threshold, at block 470 the second stage is engaged and stronger pressure is applied to fully seat the DIMM in the socket, and close the socket. In one embodiment, the pressure applied during this second stage is also monitored using the spring, with a second marking, to verify that the pressure applied is sufficient to fully seat the DIMM module. The process then ends at 480.

If the pressure is above the threshold at the interference point, as determined at block 460, at block 465 in one embodiment an alert to the alignment error or latched closed state is sent. In another embodiment, the system may attempt to re-insert. In one embodiment, the process returns to block 425, restarting the insertion process by placing the DIMM in the alignment structure for the reinsertion. In another embodiment, the process returns to block 440 for the DIMM reinsertion, placing the gripper over the socket.

Figure 5A:
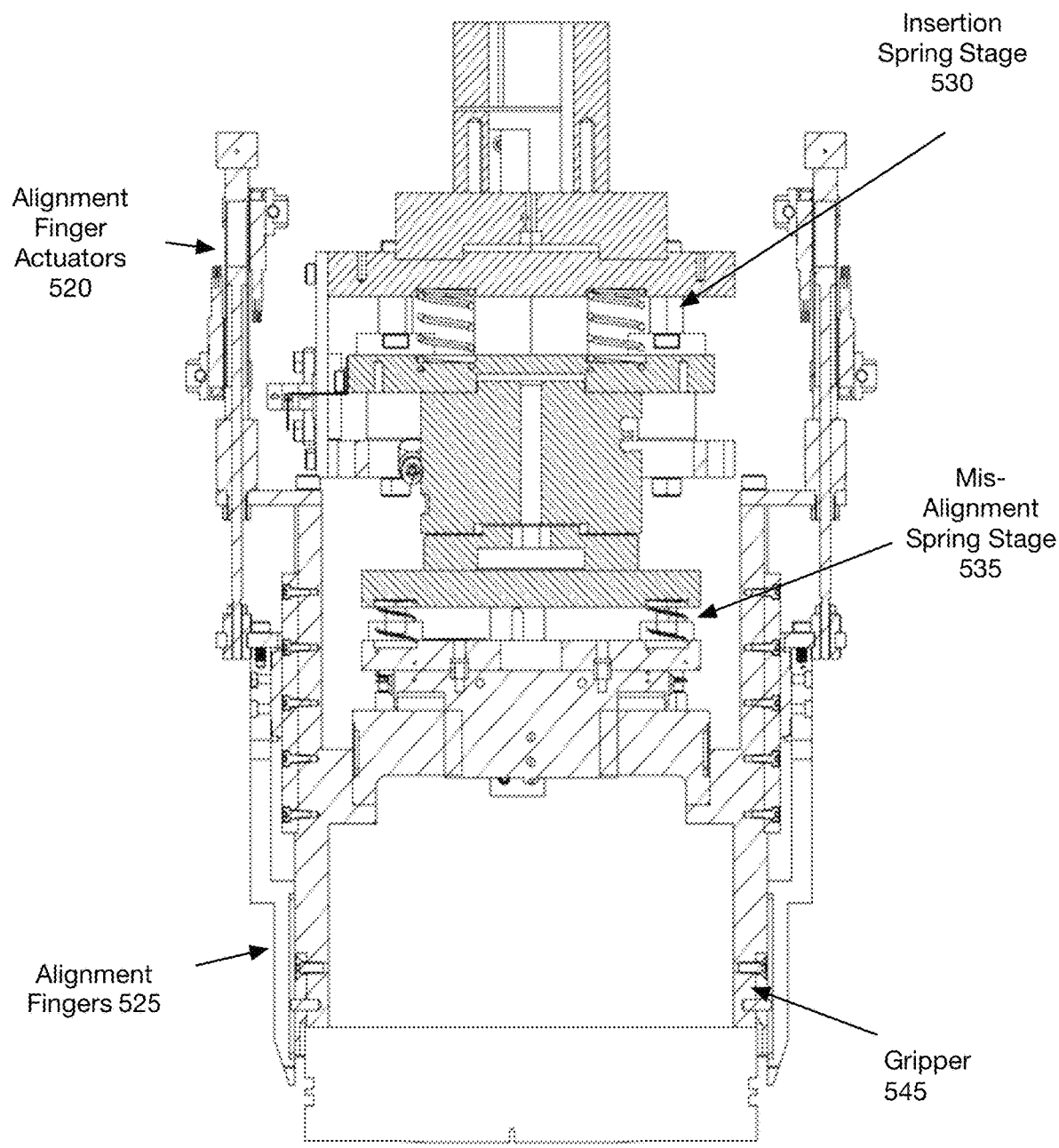
FIGS. 5A-5C are a diagram of one embodiment of the first embodiment DIMM insertion system.
Figure 5B:
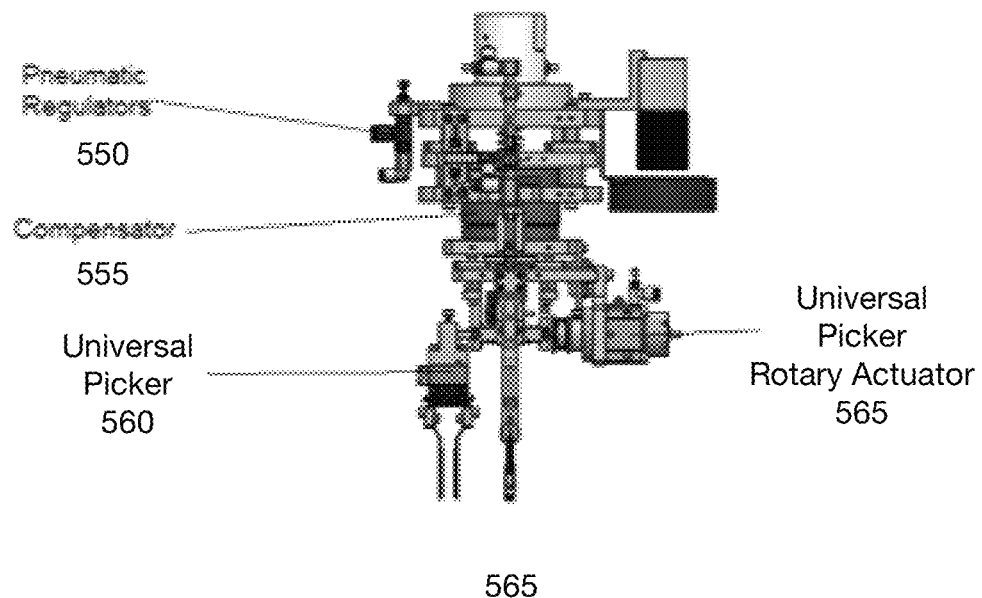
Figure 5C:
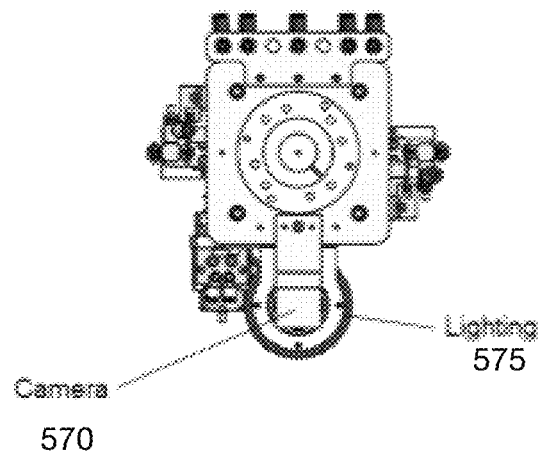
Figure 6A:
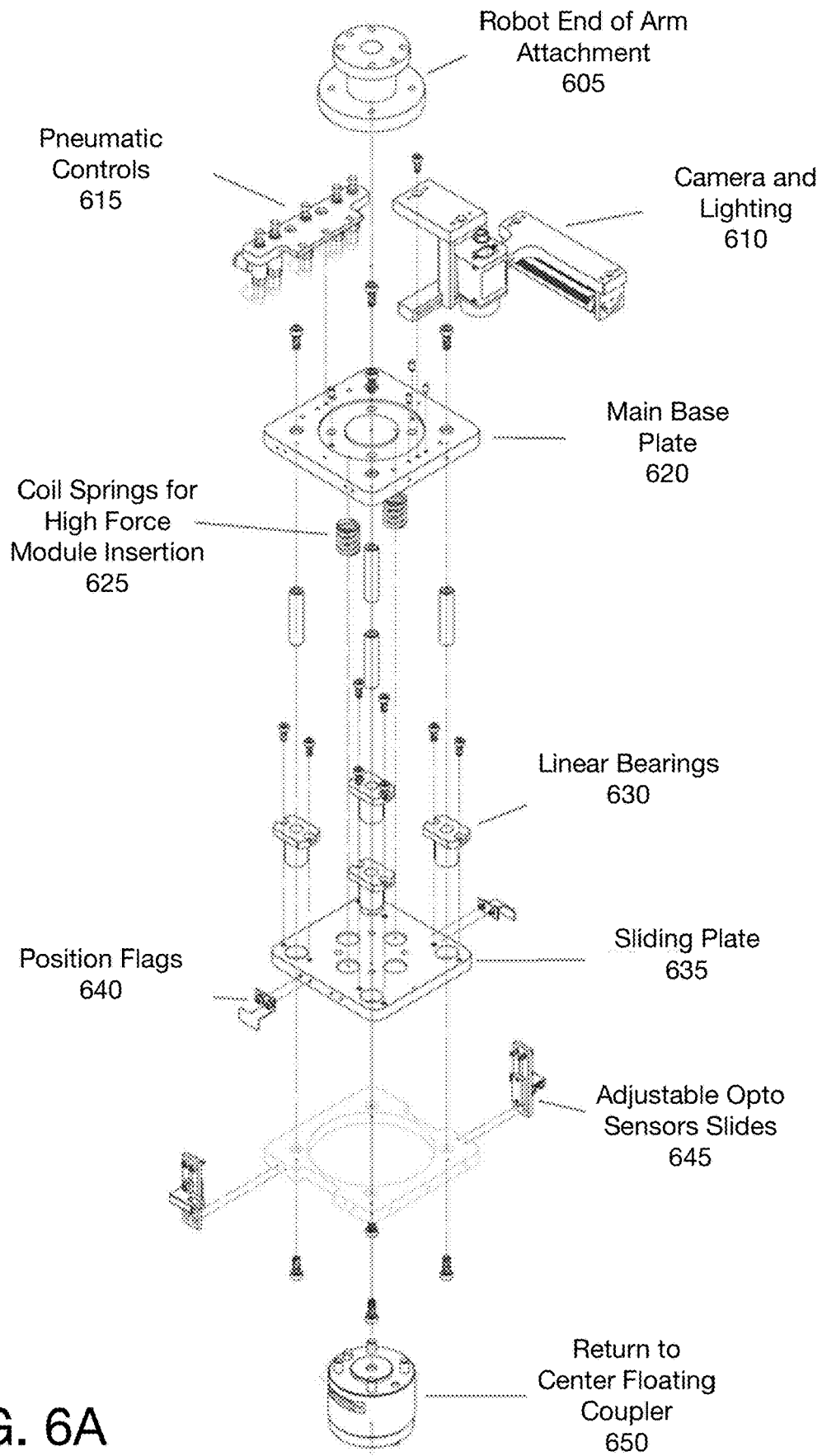
FIGS. 6A and 6B are an exploded diagram of the first embodiment of the module insertion system.
Figure 6B:
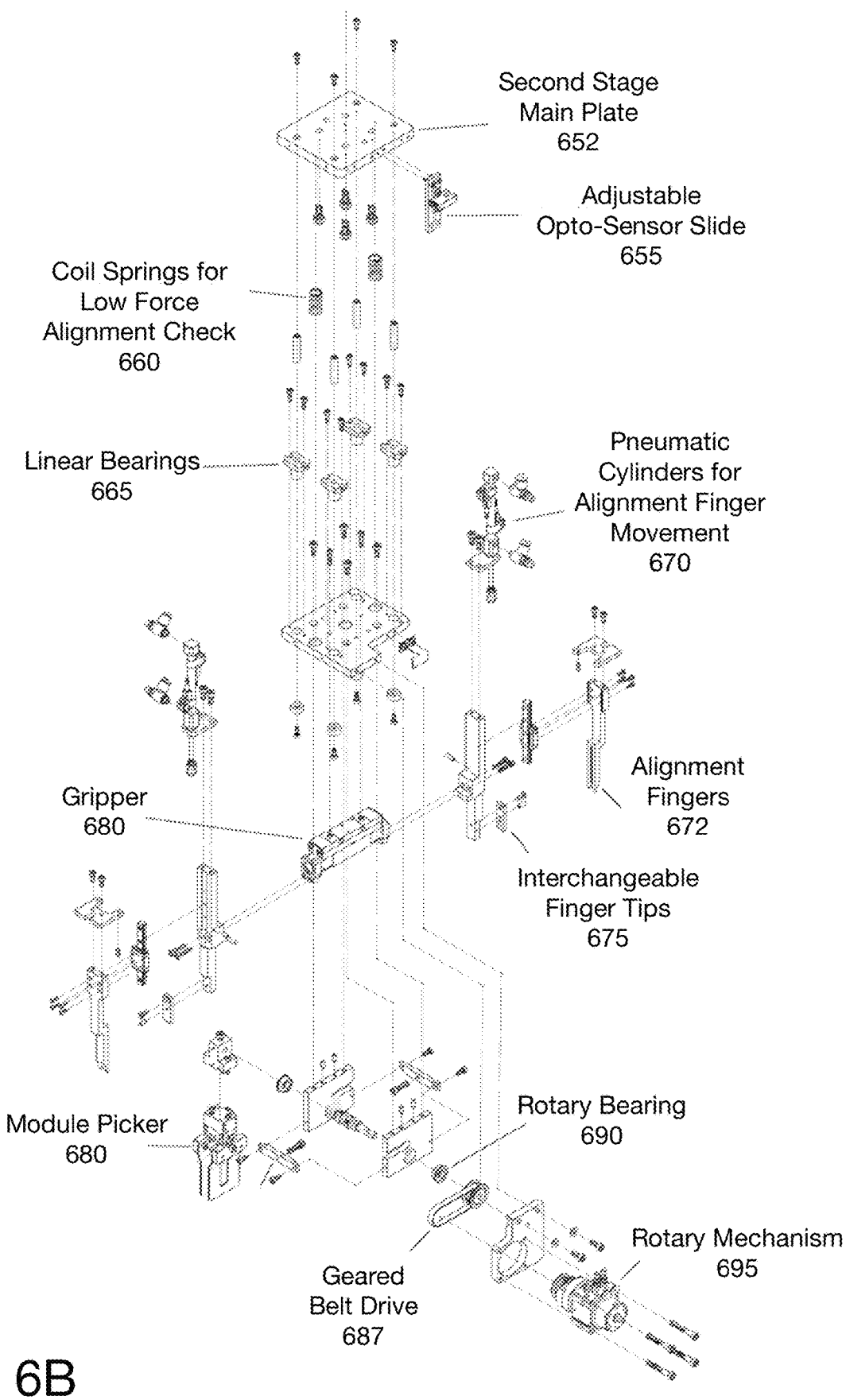

FIGS. 5A-5C are a diagram of one embodiment of the module insertion system. FIG. 5A shows a front view of one embodiment of the module insertion system, showing a DIMM in the gripper 545. The module insertion system 510 includes alignment finger actuators 520 which raise and lower the alignment fingers 525. The insertion spring stage 530 controls the full insertion, after the misalignment spring stage 535 indicates that the module is correctly aligned. An adjustable travel force photo sensor is used to sense the insertion distance.

FIG. 5B shows a side view of one embodiment of the module insertion system. The pneumatic regulators 550 are shown, as is the alignment compensator 555. The universal picker 560 and the universal picker rotary actuator 565 which enables the universal picker 550 to pick up the board regardless of its configuration is also illustrated.

FIG. 5C shows one embodiment of a top view of the module insertion system. The camera 570 and lighting 575 are shown.

FIGS. 6A and 6B are an exploded diagram of one embodiment of the module insertion system. The robot end of arm attachment 605 attaches this mechanism to a robotic assembly system. In one embodiment, the system includes a return to center floating coupler 650 which provides the movement to adjust the positioning of the gripper, discussed above. Position flags 640 are observed by the adjustable optosensors 645 when the pressure is at a calibrated point. In one embodiment, that calibrated point is 40 pounds of pressure.

The alignment fingers 672 are moved by pneumatic cylinders 670 to provide alignment of the system to a socket, as described above. Gripper 680 in one embodiment has interchangeable finger tips 675, enabling the gripper 680 to grip boards of various thicknesses and sizes.

Figure 7:
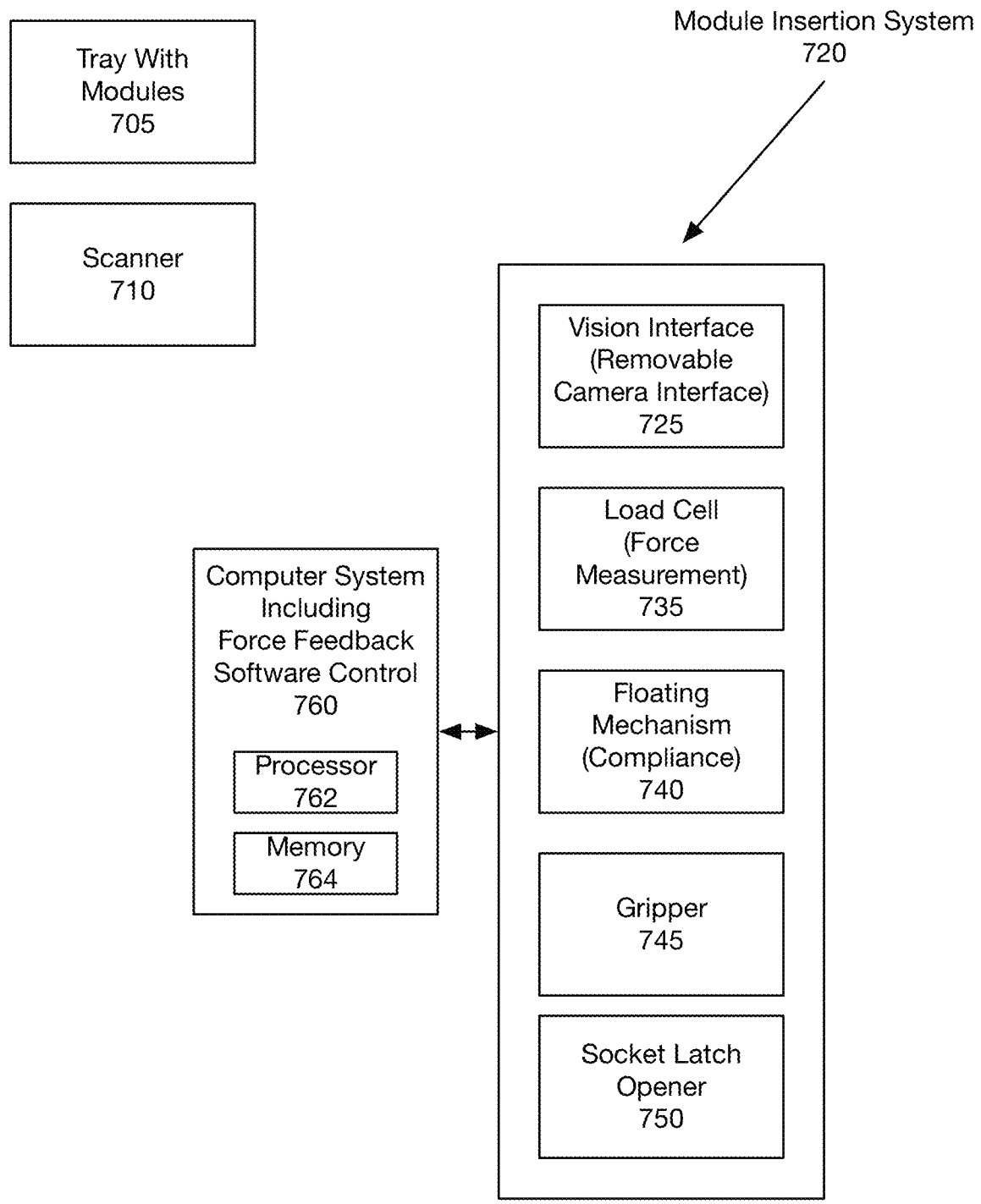
FIG. 7 is a block diagram of one embodiment of a second configuration of a DIMM insertion system.

FIG. 7 is a block diagram of one embodiment of a second configuration of a module insertion system. The module insertion system 720 takes a module from a tray 705, and inserts it into a socket (not shown). In one embodiment, the module is scanned prior to insertion for verification.

In one embodiment, the module insertion system 720 includes a vision interface 725. The vision interface 725 is a removable camera, in one embodiment, used to verify the positioning of the socket. In one embodiment, this is done based on the fiducials on the board. The output of the vision interface 725 is sent to the computer system 760 for analysis, in one embodiment.

A load cell 735 is used to provide force measurements, to indicate insertion force. The load cell 735 output is used to determine whether the module is correctly aligned, after the module has engaged with the socket but prior to exerting a level of force that would damage the board. The load cell in one embodiment outputs a force measurement to a computer system 760. The load cell 735 is used to ensure that the module for insertion is properly aligned. The load cell 735 measures the force, as the module slides into the socket, and the force when the insertion is completed. The load cell 735 output is used by the computer system to determine whether the module is misaligned or there is another issue. If the sensor value goes above the amount of force needed to slide the module into the slot, at a first stage, something in the system is misaligned.

In one embodiment, a floating mechanism 740 provides compliance enabling small shifts in the position of the module relative to the socket, to enable insertion. The gripper 745 is coupled to the floating mechanism so that it can shift providing the compliance.

Figure 10C:
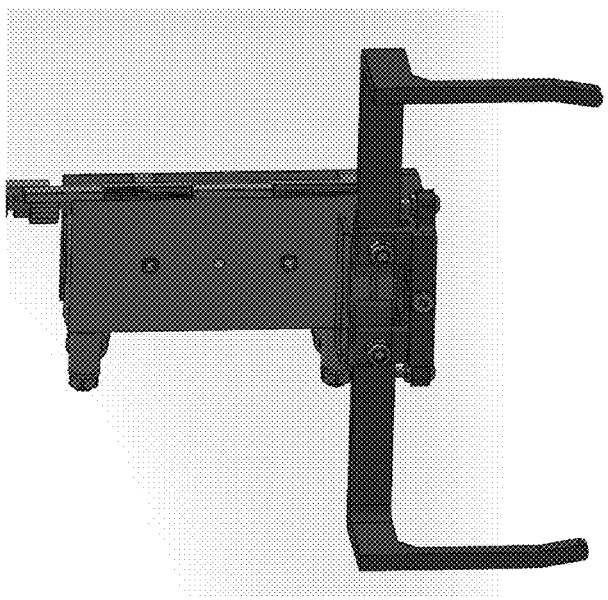
FIGS. 10A-10C are an illustrations of elements of the second configuration of the module insertion system.
Figure 10B:
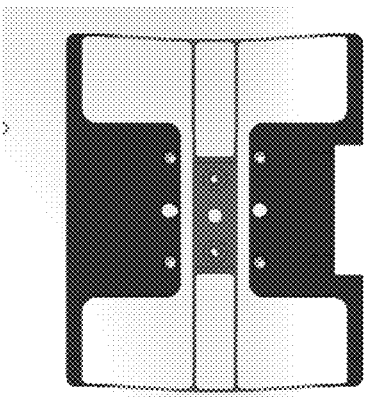
Figure 10A:
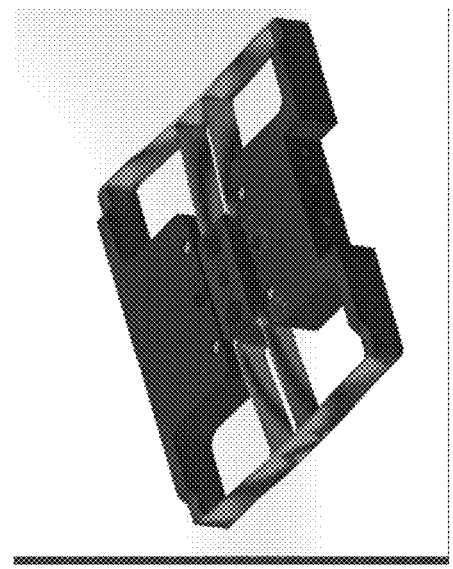

FIGS. 10A and 10B illustrate one embodiment of the floating mechanism used. In one embodiment, the movement side-to-side of the center metal element, and the movement end-to-end of the frame elements provides compliance. In one embodiment, the floating mechanism 740 is made from a material with a relatively high ultimate strength to elastic modulus ratio. In one embodiment, the material is a metal. In one embodiment, the metal is a half-hard to fully hardened aluminum alloy, or another material that is used for flexure. In one embodiment, the material is the 6000 series aluminum alloy preferably in its half-hard to fully hardened temper, for example T4 to T6 condition. In one embodiment, the length and thickness of the floating mechanism 740 is designed to provide stability and approximately +/−0.3 mm of movement side to side, and front to back.

The gripper in one embodiment is a parallel gripper to pick and place the module. In one embodiment, the XYZ gripper from FESTO Corporation™ is used.

In one embodiment, a socket latch opener 750 is attached to the system. In one embodiment, when the gripper is above the socket, the socket latch opener 750 is lowered to automatically open the socket prior to the module insertion. This enables elimination of separate latch opening process. In one embodiment, latch opener are rigid arms shaped to engaged with the socket latch. FIG. 10C illustrates one embodiment of the socket latch opener 750. FIGS. 12A-12D illustrate another embodiment of the socket latch opener.

Figure 8:
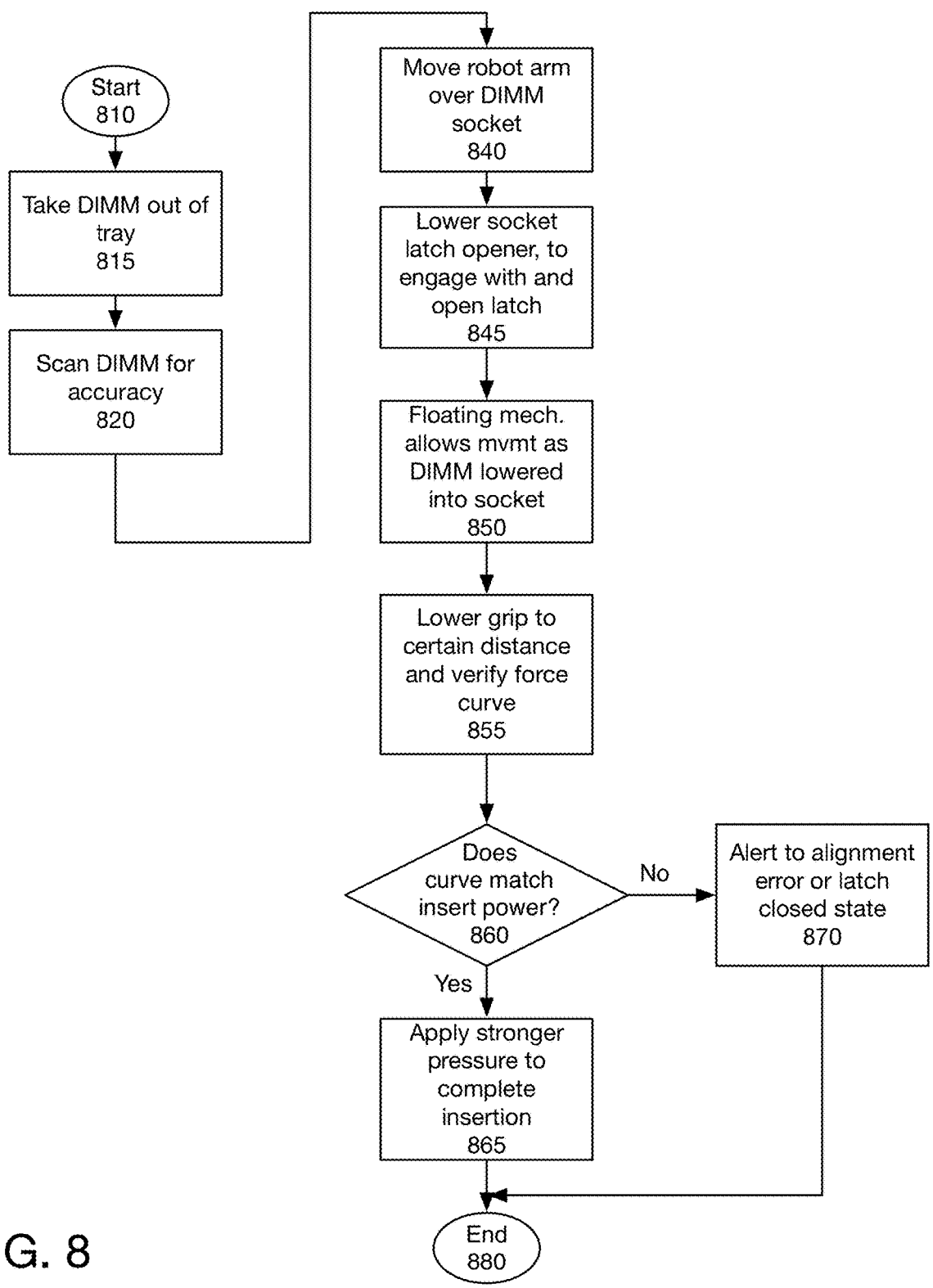
FIG. 8 is a flowchart of one embodiment of using the second configuration of the module insertion system.

FIG. 8 is a flowchart of one embodiment of using the second configuration of the module insertion system. The process starts at block 810. In one embodiment, the module inserted is a DIMM module. At block 815, the gripper is used to pick up the DIMM out of a tray. In one embodiment, at block 820, the DIMM is scanned for accuracy.

At block 840, the robot arm is moved over the DIMM socket. At block 845, the socket latch opener is lowered, to engage with the DIMM socket latch, and open it (if it is closed). In one embodiment, a separate motor lowers the socket latch opener.

At block 850, the floating mechanism allows small movements, as the DIMM is lowered into the socket. The chamfer at the edge of the socket allows the system to self-align with the floating mechanism providing the movement flexibility.

At block 855, the system lowers the gripper including the DIMM board to a first distance and verifies the force curve. The force curve is the force exerted on the gripper (via DIMM board) over time. The force curve has a predictable level, as the gripper is lowered to insert the DIMM into the socket. There may be minor variations in force levels detected due to the impact with the chamfer portion of the socket, and/or other variations. However, a properly inserted DIMM board in a socket remains below a threshold.

At block 860, the process determines whether the force curve observed matches the expected curve for an aligned DIMM module. If the DIMM module/socket is misaligned, or the latch is closed, the force detected would be higher than a threshold, which is the maximum force a DIMM that is aligning correctly may experience. In one embodiment, the maximum force exerted in this stage of insertion is below the force that would damage the DIMM board or the socket. Thus, even if the DIMM is misaligned, there should not be any damage. If the force curve matches the expected force curve, and is not above the threshold, at block 865 the stronger pressure is applied to complete the insertion. The insertion completion closes the latch. The process then ends at block 880.

If the curve does not match, indicating that the latch is not open, the DIMM and/or socket are misaligned, or there is another issue that makes the completion of insertion unavailable, the process continues to block 870. At block 870 the process in one embodiment alerts to the error. As noted above, in one embodiment, the system may reattempt the insertion prior to sending an alert. In one embodiment, instead of sending an alert, if multiple re-attempts fail, the DIMM board and/or the socket is deemed damaged, and skipped. The process then ends, at block 880. Although this process shows only one DIMM insertion, in a real-world system such DIMM insertion processes would occur in rapid succession.

Figure 9A:
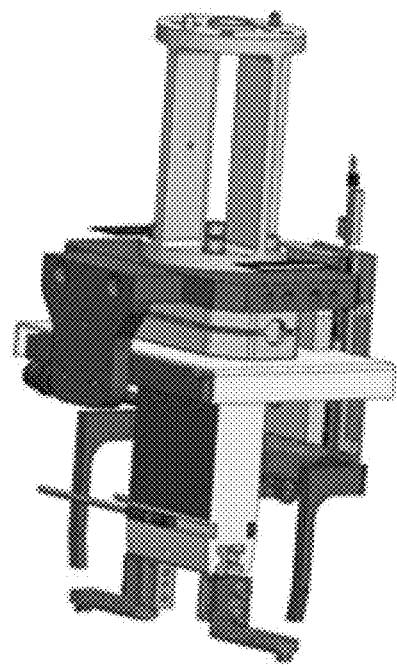
FIGS. 9A and 9B are illustrations of one embodiment of the second configuration of the module insertion system.
Figure 9B:
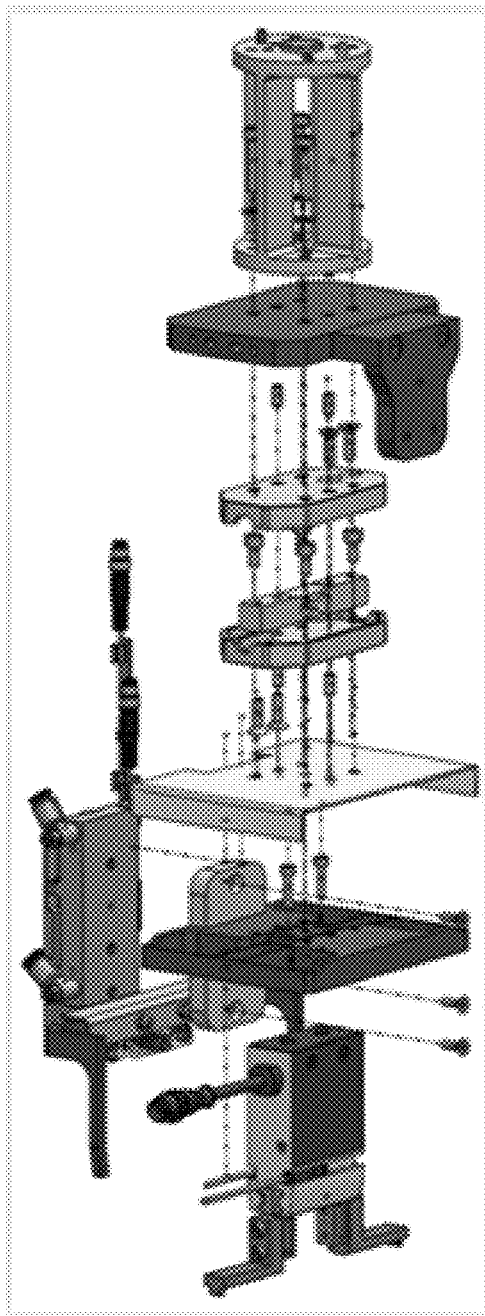

FIGS. 9A and 9B are illustrations of one embodiment of the second configuration of the module insertion system. FIG. 9B illustrates an exploded view of the system.

Figure 11:
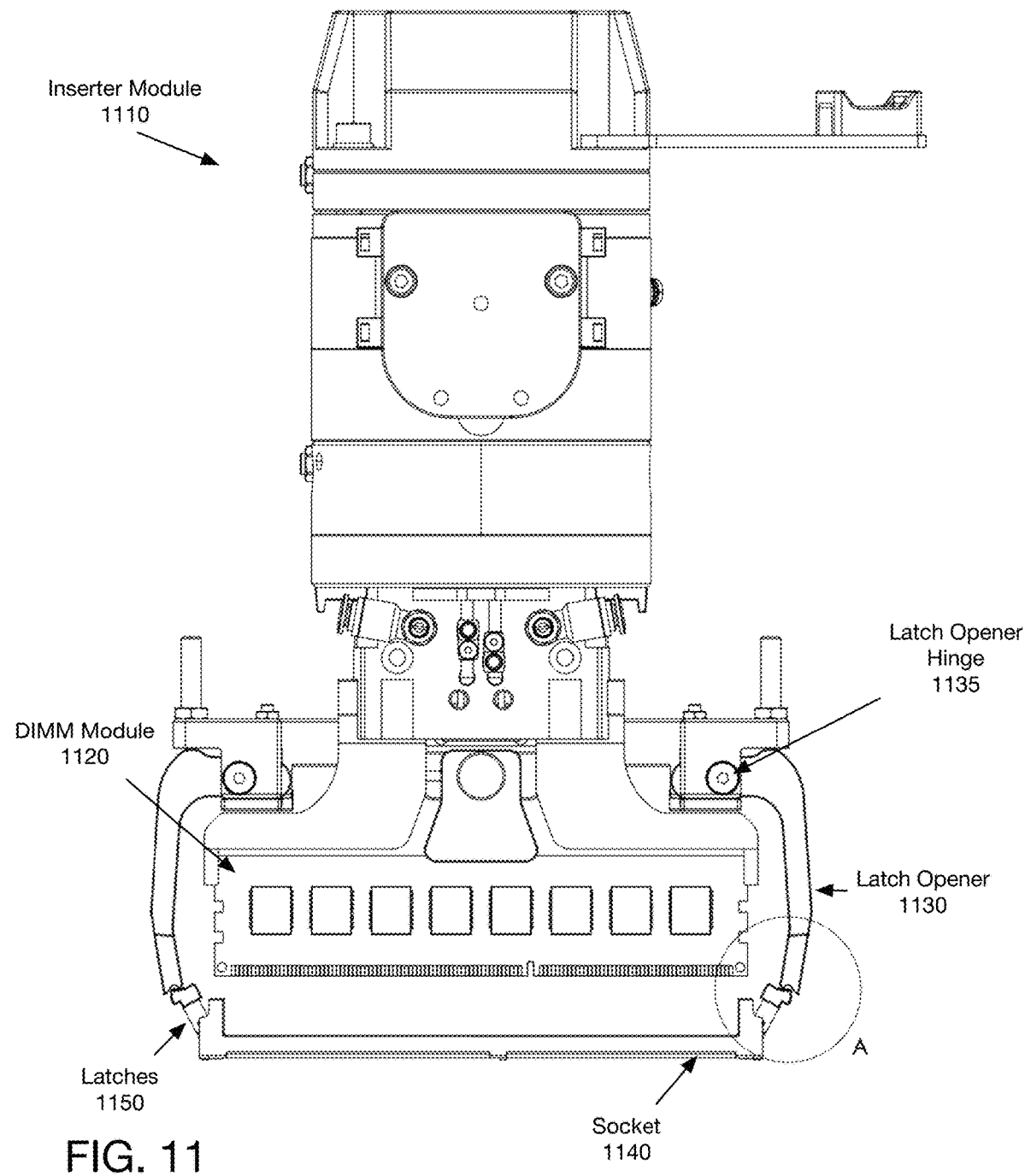
FIG. 11 is an illustration of one embodiment of the module inserter, with an improved latch opener.

FIG. 11 is an illustration of one embodiment of the module inserter, with a socket latch opener. This example illustrates a DIMM inserter. The module inserter 1110 is holding a DIMM module 1120. The module inserter includes two latch openers 1130, on either side of the module. The latch openers 1130 are designed to engage with the latches 1150 of the socket 1140. A standard DIMM socket 1140 includes two latches, which must be opened to insert the DIMM module, and which automatically close when the DIMM module 1120 is fully seated in the socket 1140. As can be seen in this example, the DIMM module 1120 is above the socket, and not yet engaged with the socket. The latch opener 1130 is designed to be lowered, to open the latches 1150 before the DIMM module 1120 engages with the socket 1140, in one embodiment. The latch opener 1130, in one embodiment, is attached to the DIMM inserter 1110 via a hinge 1135. The latch opener 1130 in one embodiment is lowered, and rotates outward as it engages with an opens the latch. FIGS. 12A-12D illustrates this process.

Figure 12A:
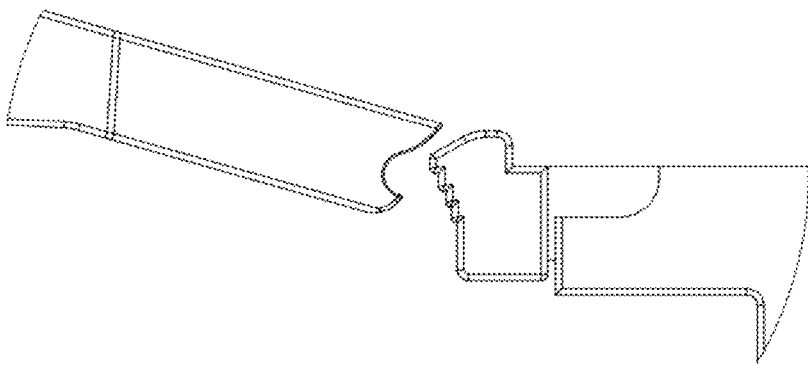
FIGS. 12A-12D illustrate the latch opener of FIG. 11, as it approaches, engages, and fully opens the latch.
Figure 12B:
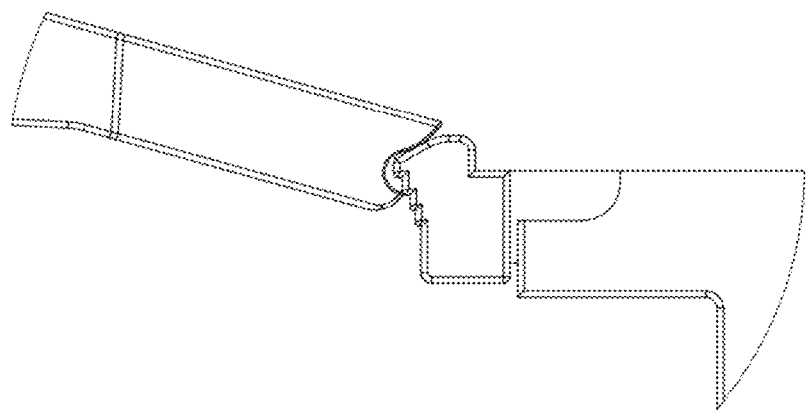
Figure 12C:
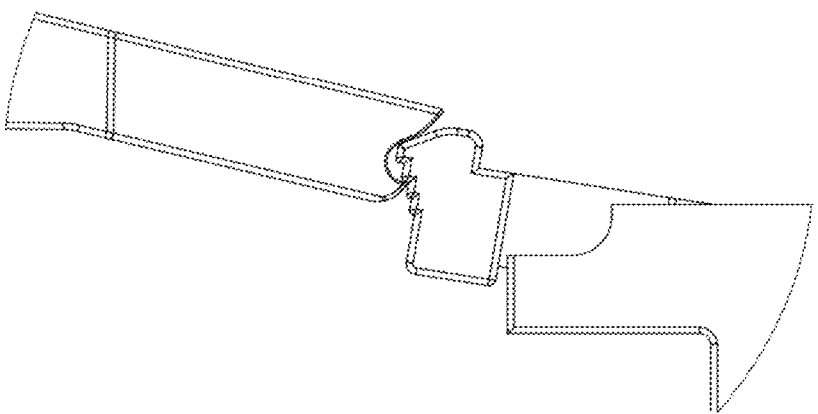
Figure 12D:
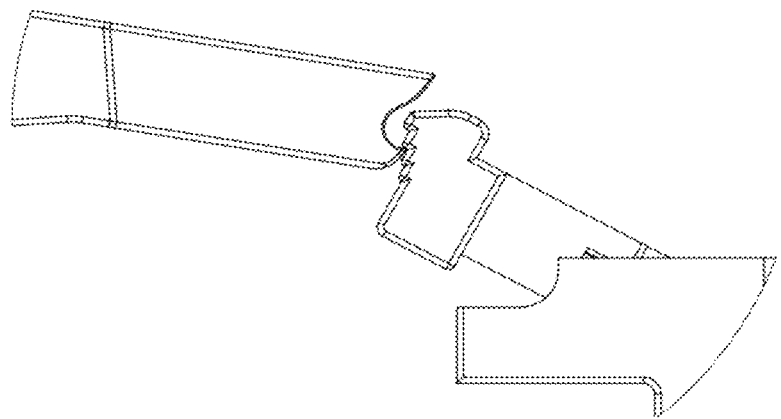

FIGS. 12A-12D illustrate the latch opener of FIG. 11, as it approaches, engages, and fully opens the latch. FIG. 12A illustrates the latch opener at the approach. The hook or catch portion of the latch opener is designed to engage with the latch, regardless of the exact angle of approach and regardless of small shifts in position between the latch opener and the latch. Once the latch opener hooks on to the latch, as can be seen in FIG. 12B, the latch opener is lowered and that motion opens the latch fully, as can be seen in FIG. 12D. In one embodiment, the latch opener freely pivots around a hinge, as the latch opener is lowered, so the movement of the latch opening system is downward. This enables a simple mechanism for the latch opener, while still providing accurate and rapid latch opening. The shape of the latch opener head, with a catch to engage the latch ridges, enables the latch opener to remain in contact with the latch as it rotates to the open position. In one embodiment, the latch opener head has a cusp that is sufficiently relieved to enable the full rotation of the latch opener, without getting stuck on the latch. In one embodiment, the full rotation may be 0-20 degrees as shown.

Figure 13A:
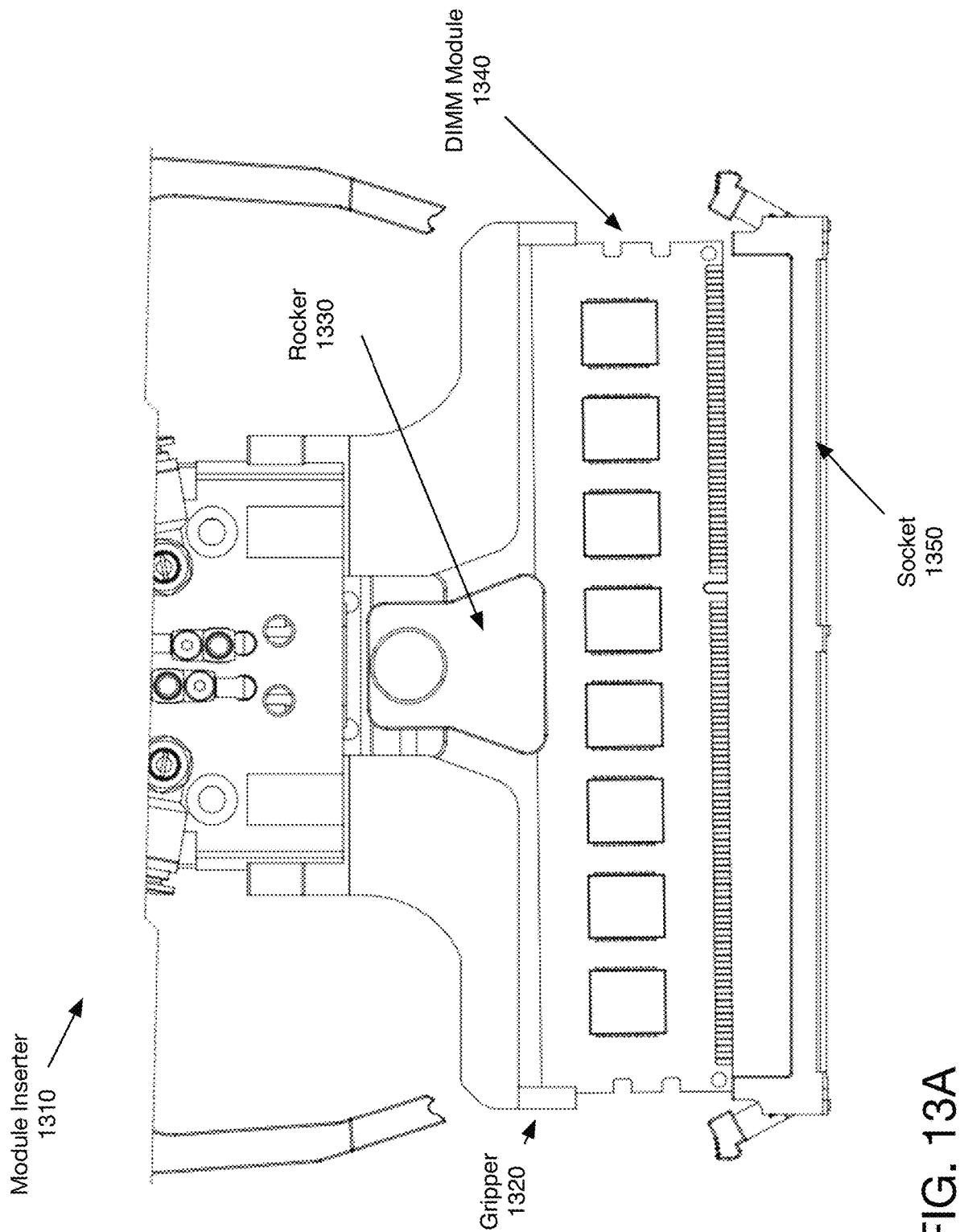
FIG. 13A is an illustration of one embodiment of a rocker for providing central insertion force for the second stage insertion of the module.

FIG. 13A is an illustration of one embodiment of a rocker for providing central insertion force for the second stage insertion of the module. Module inserter 1310 includes gripper 1320, to grip DIMM module 1340 for insertion into a socket 1350. In one embodiment, the module inserter 1310 includes a rocker 1330, to provide downward force on the DIMM module 1340, for insertion. This moves the insertion force from the edge of the DIMM module 1340 by grippers 1320 to the center of the DIMM module 1340 by the rocker. 1330.

The rocker 1330 in one embodiment is attached moveably, so that it can rotate around a center axis, and move forward and backward. The rocker 1330 in one embodiment, has a V-shaped groove, shaped to enable the rocker to securely push the module. These two movements enable the rocker 1330 to align with the DIMM module 1340, even if the DIMM module is being held unevenly.

In the illustration of FIG. 13A, the DIMM module 1340 is being held by the grippers at a slight angle. This can be seen from the interface between the grippers 1320 and the module 1340, as well as the fact that one corner of the module 1340 touches the socket 1350, while the other one does not.

Figure 13B:
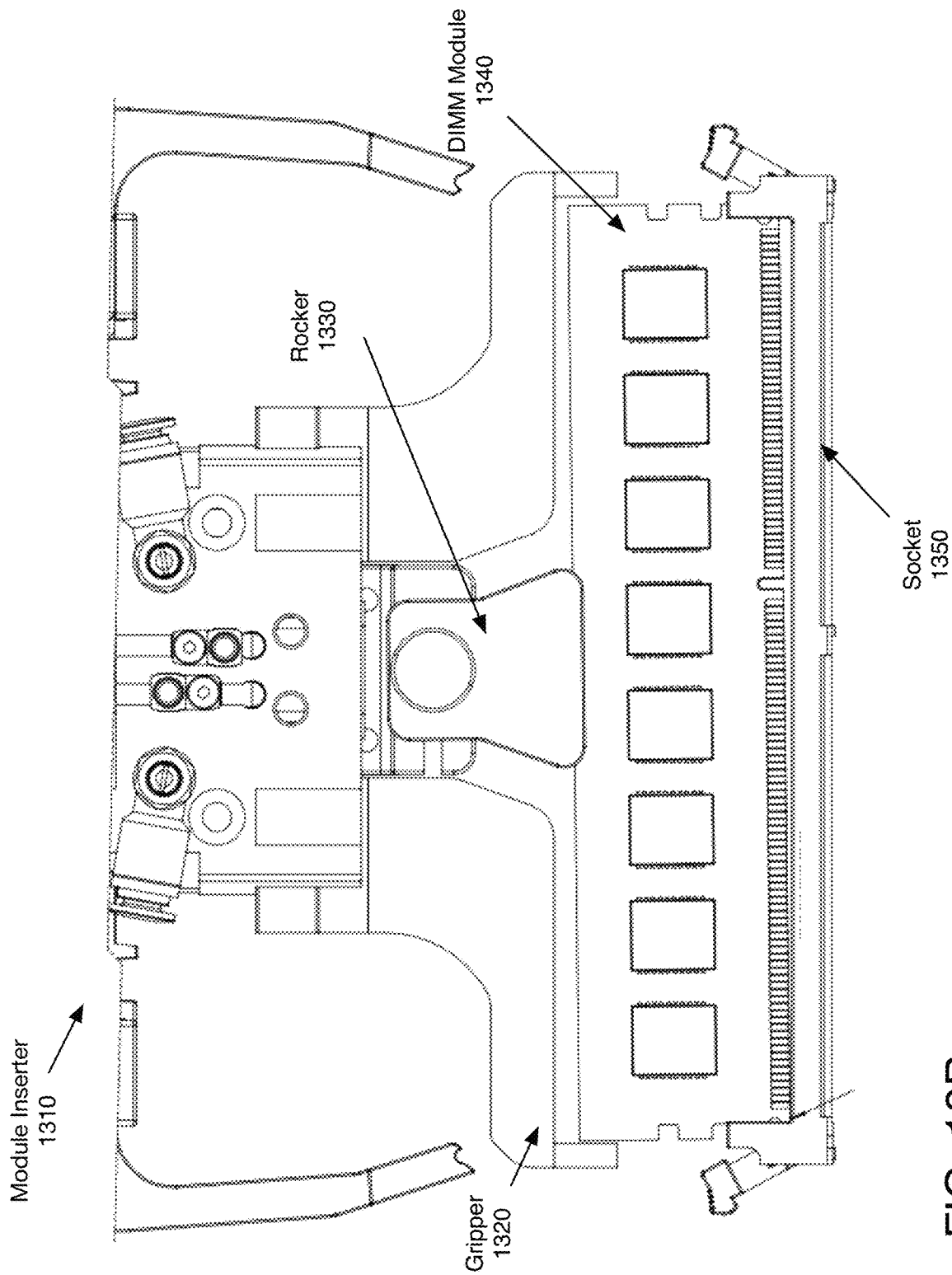
FIG. 13B is an illustration of the rocker of FIG. 13A when the DIMM is misaligned, in the socket.

FIG. 13B is an illustration of the rocker of FIG. 13A when the DIMM is misaligned, but the DIMM module is partially in the socket. As can be seen, the DIMM module 1340 remains misaligned, with one side of the module nearly fully seated, while the other side is higher. The rocker 1330 is fully engaging with the DIMM module. However, as can be seen, the grippers 1320 have partially released the DIMM module, which is now being supported by the socket, and held in place by the rocker. The socket 1350 has the outer projected flange, which aligns the module 1340, and a long central groove with spring contacts that engage each trace on the module 1340 once it is fully inserted. Therefore, misalignment at the time the module 1340 initially contacts the socket 1350 can be corrected, but if the module 1340 remains misaligned, it cannot make correct contact.

Therefore, after initial contact with the socket 1350, the grippers 1320 partially release, and the rocker 1330 is able to slide along the top edge of the module 1340 and maintain the same angle as the module as the module aligns to the socket. The module 1340 aligns to the socket 1350 from the moment applied to it by the top edge of the flange of the socket 1350 during insertion.

Figure 13C:
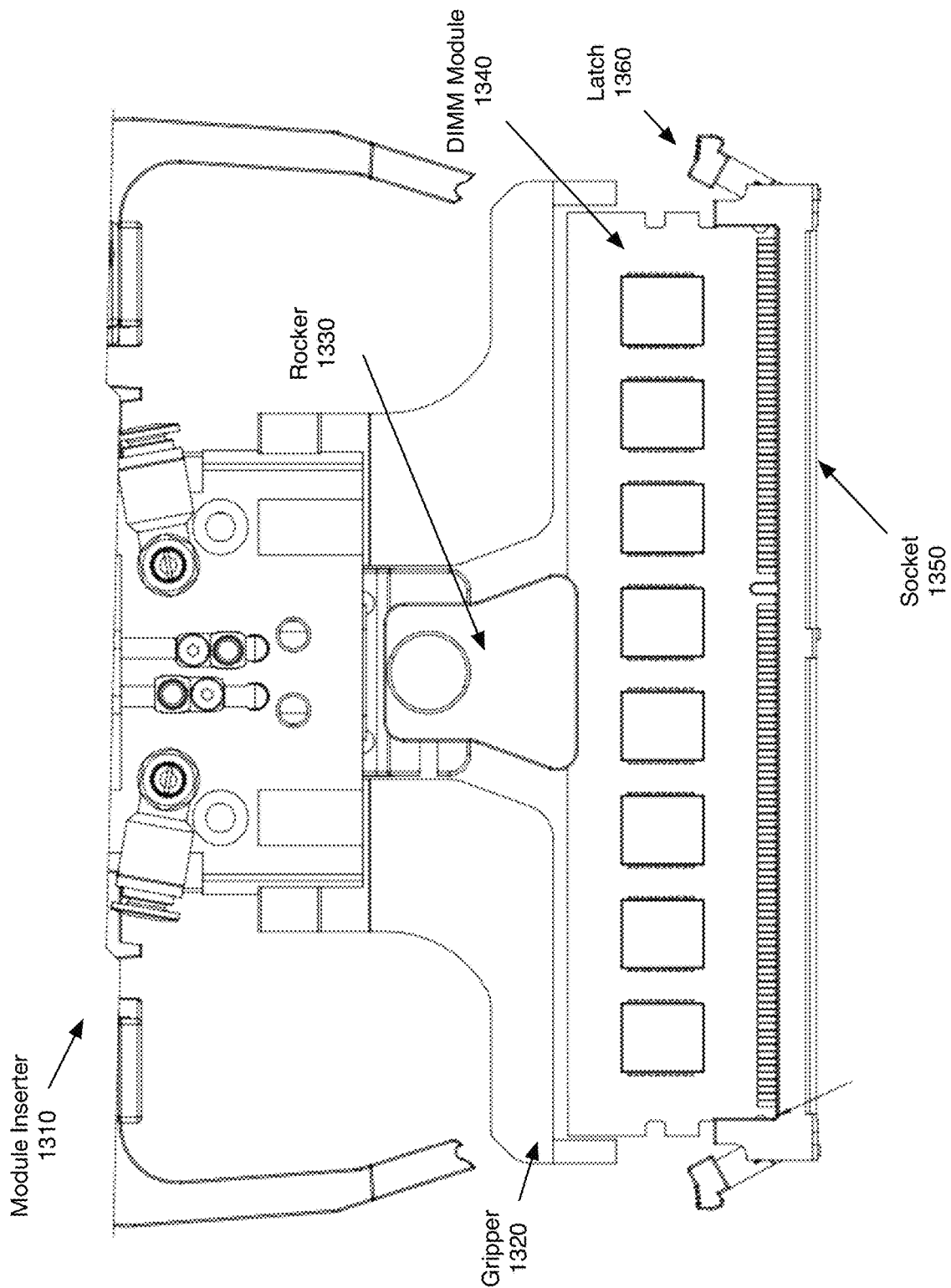
FIG. 13C is an illustration of the rocker of FIG. 13A after the DIMM is aligned by the rocker

FIG. 13C is an illustration of the rocker of FIG. 13A after the DIMM is aligned by the rocker. The DIMM module 1340 is now correctly seated in the socket, but has not yet been re-gripped by the grippers, or pushed down to close the latches 1360. Due to the release of the gripper, and the alignment by the socket and the rocker, the gripper 1320 is now correctly holding the DIMM module 1340.

Figure 13D:
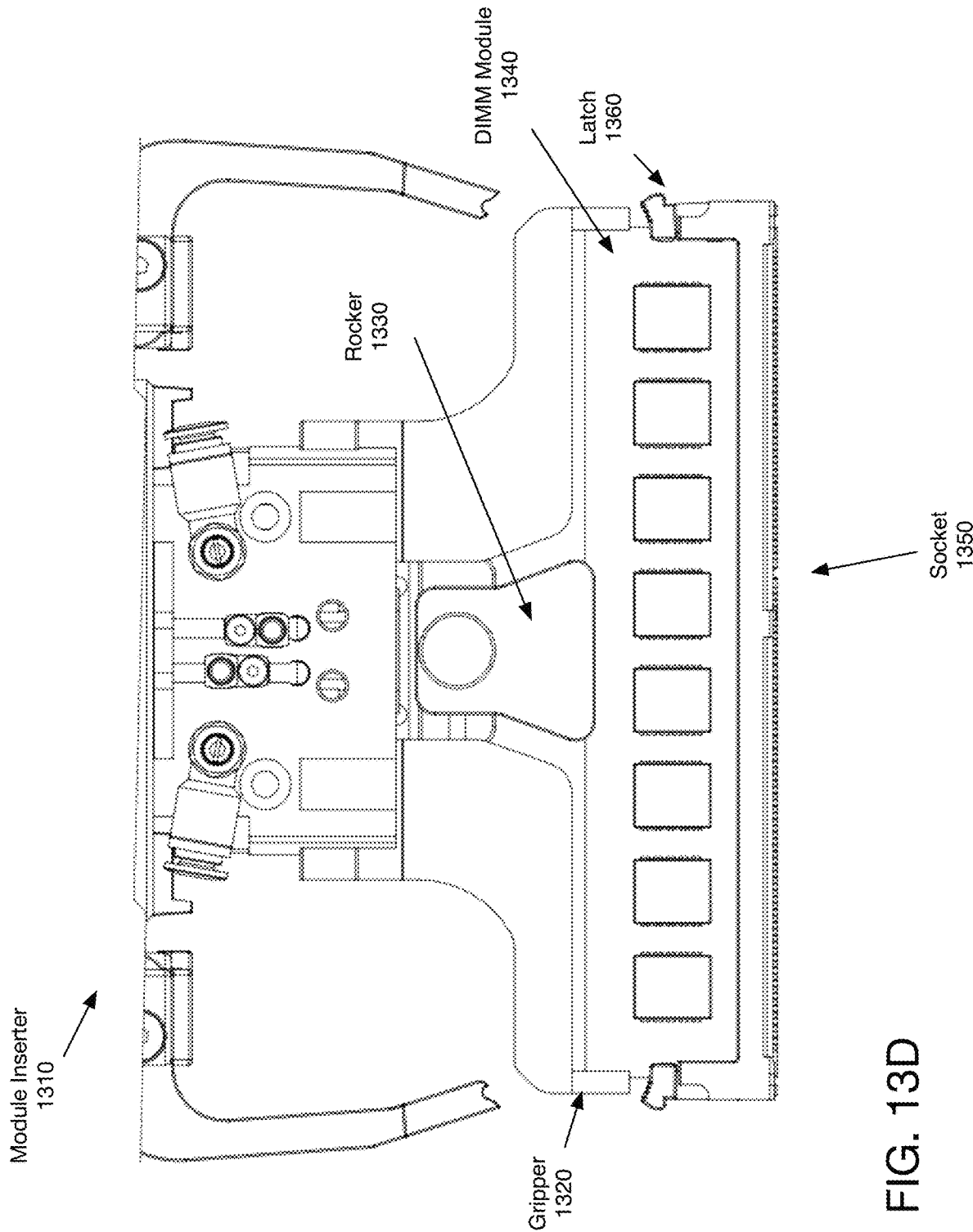
FIG. 13D is an illustration of the rocker of FIG. 13A after the DIMM is fully inserted.

FIG. 13D is an illustration of the rocker of FIG. 13A after the DIMM is fully inserted. Once the DIMM module 1340 is positioned in the socket 1350, the rocker is used to push down the DIMM module 1340 to fully seat it, and close the latches 1360.

Note that the elements from the embodiments described may be mixed. In one embodiment, the system includes a compliance element, and a two-stage insertion. But for example the latch openers of the second embodiment may be combined with the compliance element of the first embodiment, the alignment fingers of the first embodiment may be applied to the second embodiment, and so on.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

We claim:

1. A insertion system including a module inserter comprising:
   a gripper configured to grip a module for insertion;
   a compliance element to provide movement along an XY axis and (theta) rotation to the gripper;
   a rocker positioned at a center of the module for insertion;
   a first stage insertion control to insert the module into a socket using the gripper, to a first level;
   a second stage insertion control to complete the insertion of the module into the socket using the rocker, when the first stage insertion control indicates that the module is aligned to the socket, the second stage insertion control exerts force at a center of the module for insertion using the rocker to complete the insertion of the module into the socket.

2. The insertion system of claim 1, further comprising:
   alignment fingers to align the gripper to the socket, prior to the first stage insertion control inserting the module into the socket.

3. The insertion system of claim 1, further comprising:
   a socket latch opener lowered to open a socket latch, the socket latch opener extending below the gripper.

4. The insertion system of claim 3, wherein the socket latch opener comprises: a tang and a relief to engage with the socket latch, and to rotate to open the socket latch.

5. The insertion system of claim 1, further comprising:
   a picker to pick up the module from a tray.

6. The insertion system of claim 5, further comprising:
   a registration fixture to receive the module from the picker;
   wherein the gripper picks up the aligned module from the registration fixture, thereby ensuring that a hold of the gripper is consistent.

7. The insertion system of claim 1, wherein the compliance element comprises:
   a rigid frame; and
   flexible arms which provide lateral movement for compliance.

8. The insertion system of claim 7, wherein the flexible arms are made of a half-hard or fully hard aluminum.

9. The insertion system of claim 1, wherein the compliance element comprises a floating double disk providing free movement along a plane.

10. The insertion system of claim 1, wherein the first stage insertion control comprises:
    a first spring set, wherein the first spring set is compressed when the module is inserted to a first level into the socket; and
    a sensor to determine whether the first spring set has been compressed more than a force threshold when the module is inserted to the first level, wherein compression above the force threshold indicates that the module is misaligned.

11. The insertion system of claim 10, wherein the sensor is an opto-sensor, and a flag indicates the compression level.

12. The insertion system of claim 1, wherein the first stage insertion control comprises:
a load cell to measure force; and
a processor to determine whether force curve indicates proper alignment.

13. The insertion system of claim 1, further comprising:
the rocker moveably attached to engage with the module, and to provide pressure to seat the module in the socket, such that the pressure is at the center of the module.

14. The insertion system of claim 13, wherein the rocker includes a shaped groove to engage with the module.

15. The insertion system of claim 13, wherein the gripper releases the module, when the module is in the socket, and the rocker and the socket align the module, prior to completing the insertion.

16. A robotic insertion system to insert a module into a socket, comprising:
a robot arm;
a module inserter end-of-arm element on the robot arm comprising:
a gripper to grip the module;
a compliance element to provide movement along an XY axis and (theta Z) rotation to the gripper;
the gripper to insert the module into a socket, with a first stage insertion control;
the robotic insertion system to complete the insertion of the module into the socket, when the first stage insertion control indicates that the module is aligned to the socket, the robotic insertion system exerting force with a rocker element at a center of the module to complete the insertion of the module into the socket.

17. The robotic insertion system of claim 16, wherein the compliance element comprises a floating double disk providing free movement along a plane.

18. The robotic insertion system of claim 16, wherein the first stage insertion control comprises:
a load cell to measure force; and
a processor to determine whether a force curve indicates proper alignment.

19. A method of inserting a module into a socket using a two-stage insertion comprising:
gripping a module with a gripper, the gripper having movement along an XY axis and (theta) rotation for compliance;
inserting the module into a socket to a first level;
determining whether the first level insertion indicates that the module is correctly aligned to the socket;
when the module is not correctly aligned to the socket, re-gripping the module; and
when the module is correctly aligned to the socket, completing the insertion of the module into the socket by applying force using a rocker positioned at a center of the module to exert enough force to seat the module in the socket.

20. The method of claim 19, further comprising:
releasing the module with the gripper, when the module is correctly aligned to the socket, and exerting force with the rocker to seat the module.

21. The robotic insertion system of claim 16, wherein the gripper releases the module, when the module is in the socket, and the rocker element and the socket align the module, prior to the rocker element exerting downward force to complete the insertion.

22. The robotic insertion system of claim 16, further comprising:
a picker to pick up the module from a tray; and
a registration fixture to receive the module from the picker;
wherein the gripper picks up the aligned module from the registration fixture, thereby ensuring that a hold of the gripper is consistent.

* * * * *